(12) United States Patent
Adams et al.

(10) Patent No.: US 6,989,224 B2
(45) Date of Patent: Jan. 24, 2006

(54) POLYMERS WITH MIXED PHOTOACID-LABILE GROUPS AND PHOTORESISTS COMPRISING SAME

(75) Inventors: Timothy G. Adams, Sudbury, MA (US); Matthew A. King, Boston, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/268,033

(22) Filed: Oct. 9, 2002

(65) Prior Publication Data

US 2004/0002017 A1 Jan. 1, 2004

Related U.S. Application Data

(60) Provisional application No. 60/327,987, filed on Oct. 9, 2001.

(51) Int. Cl.
*G03F 7/039* (2006.01)
*G03F 7/30* (2006.01)
*C08F 220/12* (2006.01)
*C08F 220/18* (2006.01)
*C08F 116/12* (2006.01)

(52) U.S. Cl. .................. 430/270.1; 430/326; 430/905; 430/910; 430/914; 526/320; 526/329.6; 526/332; 526/333; 526/334

(58) Field of Classification Search ............ 430/270.1, 430/905, 910, 914, 326; 526/320, 329.6, 526/332, 333, 334
See application file for complete search history.

(56) References Cited

U.S. PATENT DOCUMENTS 5,670,299 A * 9/1997 Urano et al. ............. 430/270.1
6,013,411 A     1/2000 Aoai et al.
6,306,554 B1   10/2001 Barclay et al.
6,309,793 B1 * 10/2001 Malik et al. ............. 430/270.1
6,369,181 B1    4/2002 Jung et al.
6,517,990 B1 *  2/2003 Choi et al. ............... 430/270.1
6,680,159 B2    1/2004 Barclay et al.
6,692,888 B1    2/2004 Barclay et al.
6,783,917 B2 *  8/2004 Blakeney et al. ........ 430/270.1
2001/0035394 A1 * 11/2001 Takeda et al. ................. 216/41
2001/0038971 A1 * 11/2001 Ohsawa et al. .......... 430/270.1
2001/0053496 A1   12/2001 Adams
2002/0009668 A1 *  1/2002 Nishimura et al. ....... 430/270.1
2002/0042017 A1 *  4/2002 Hatakeyama et al. .... 430/270.1
2002/0061464 A1 *  5/2002 Aoai et al. ............... 430/270.1
2002/0155376 A1 * 10/2002 Hashimoto et al. ...... 430/270.1
2003/0073030 A1    4/2003 Barclay et al.
2003/0108811 A1 *  6/2003 Mizutani et al. ......... 430/270.1
2003/0232273 A1   12/2003 Adams et al.
2003/0235781 A1   12/2003 Adams et al.
2004/0002017 A1    1/2004 Tisi

FOREIGN PATENT DOCUMENTS

EP        788 031 A1    8/1997

* cited by examiner

*Primary Examiner*—Richard L. Schilling
(74) *Attorney, Agent, or Firm*—Peter F. Corless; Darryl P. Frickey; Edwards & Angell, LLP

(57) ABSTRACT

The invention provides novel polymers and photoresist compositions that comprise the polymers as a resin component. Polymers of the invention contain two distinct groups which can undergo a deblocking reaction in the presence of photogenerated acid, wherein one of the deblocking moieties is an acetal group. The second photoacid-labile group is suitably an ester, particularly as provided by polymerization of an alkyl acrylate group, such as t-butylmethacrylate.

8 Claims, No Drawings

POLYMERS WITH MIXED PHOTOACID-LABILE GROUPS AND PHOTORESISTS COMPRISING SAME

The present application claims the benefit of U.S. provisional application No. 60/327,987, filed Oct. 9, 2001, which is incorporated herein by reference in its entirety.

BACKGROUND OF THE INVENTION

1. Field of the Invention

The present invention relates to new polymers that contain two distinct photoacid-labile groups, a first group that is an acetal group, and a second group that is other than an acetal group such as a photoacid-labile ester group e.g. as provided by polymerization of an alkyl acrylate. The invention also includes positive-acting photoresists that contains such polymers as a resin component.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist-coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are described in Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4.

More recently, chemically-amplified-type resists have been increasingly employed, particularly for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically-amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is formed, e.g., carboxyl or imide, which results in different solubility characteristics in exposed and unexposed areas of the resist coating layer. See also R. D. Allen et al., Proceedings of SPIE, 2724:334–343 (1996); and P. Trefonas et al. Proceedings of the 11th International Conference on Photopolymers (Soc. Of Plastics Engineers), pp 44–58 (Oct. 6, 1997).

While currently available photoresists are suitable for many applications, current resists also can exhibit significant shortcomings, particularly in high performance applications such as formation of highly resolved sub-half micron and sub-quarter micron features.

Consequently, interest has increased in photoresists that can be photoimaged with short wavelength radiation, including exposure radiation of about 250 nm or less, or even about 200 nm or less, such as wavelengths of about 248 nm (provided by KrF laser) or 193 nm (provided by an ArF exposure tool). See European Published Application EP915382A2. Use of such short exposure wavelengths can enable formation of smaller features. Accordingly, a photoresist that yields well-resolved images upon 248 nm or 193 nm exposure could enable formation of extremely small (e.g. sub-0.25 $\mu$m) features that respond to constant industry demands for smaller dimension circuit patterns, e.g. to provide greater circuit density and enhanced device performance.

However, many current photoresists are generally designed for imaging at relatively higher wavelengths, such as G-line (436 nm) and I-line (365 nm) are generally unsuitable for imaging at short wavelengths such as sub-200 nm. Even shorter wavelength resists, such as those effective at 248 nm exposures, also are generally unsuitable for sub-200 nm exposures, such as 193 nm imaging. For instance, current photoresists can be highly opaque to extremely short exposure wavelengths such as 193 nm, thereby resulting in poorly resolved images.

SUMMARY OF THE INVENTION

We have now found novel polymers and photoresist compositions that comprise the polymers as a resin component. Polymers of the invention contain two distinct groups in a single integral resin which groups can undergo a deblocking reaction in the presence of photogenerated acid, wherein one of the deblocking moieties is an acetal group. The second photoacid-labile group is suitably an ester, particularly as provided by polymerization of an alkyl acrylate group, such as t-butylmethacrylate.

We have found that use of such polymers of the invention can impart significant lithographic properties to photoresists containing the polymer.

Acetal groups of polymers of the invention can be provided by a variety of methods. For instance, acetal groups may be grafted onto a preformed polymer, or may be a monomer that can be polymerized to provide a polymer of the invention. For example, such acetal groups can be providing by grafting a vinyl ether compound onto reactive polymer groups such as hydroxy, carboxy and the like, e.g. grafted onto phenolic oxygens of a phenol-containing polymer. Acrylate monomers that contain such acetal groups also are suitably polymerized to provide a polymer of the invention.

The other, distinct deblocking groups can be similarly provided, i.e. a monomer containing the distinct deblocking group, such as an ester, can be co-polymerized with other monomers. Such distinct deblocking groups also can be grafted onto pre-formed polymers, e.g. ester groups can be grafted onto phenolic groups.

Polymers of the invention also may contain units in addition to the above groups. For example, polymers of the invention may contain nitrile units such as provided by polymerization of methacrylonitrile and acrylonitrile. Additional contrast enhancing groups also may be present in polymers of the invention, such as groups provided by polymermization of methacrylic acid, acrylic acid, and such acids protected as photoacid labile esters, e.g. as provided by reaction of ethoxyethyl methacrylate, t-butoxy methacrylate, t-butylmethacrylate and the like.

Generally preferred polymers of the invention contain 2, 3, 4 or 5 distinct repeat units, i.e. preferred are copolymers, terpolymers, tetrapolymers and pentapolymers that contain one or more acetal groups and distinct deblocking groups as disclosed herein. A particularly preferred terpolymer of the invention includes phenolic groups, an acetal group such as an phenolic group blocked with a vinyl ether, and a third unit that contains the distinct deblocking group, especially a deblocking ester such as provided by an alkyl acrylate, particularly t-butylmethacrylate.

Resists containing a polymer of the invention may be imaged at a variety of wavelengths, particularly shorter wavelengths such as sub-300 nm and sub-200 nm, especially 248 nm and 193 nm.

For resists imaged at 248 nm, the polymer preferably will contain aromatic units for increased etch resistance, especially phenolic and other optionally substituted phenyl units.

The invention also includes photoresists that comprise a blend of resins, where at least one of the resins comprises one type of deblocking group (such as a photoacid labile group) and a second resin of the blend contains a deblocking group distinct from a deblocking group of the first resin such as an acetal group. Preferred resins of the blend are phenolic polymers that comprise such photoacid-labile groups, either where the photoacid-labile groups are grafted onto the phenolic groups particularly the phenolic —OH groups and/or where one or more photoacid-labile groups are a component of non-phenolic units such as provided by polymerization of an acrylate that contains a photoacid-labile ester (e.g. t-butyl ester) or the like. A single resin of the blend also may contain distinct photoacid-labile groups such as photoacid-labile ester and photoacid-labile acetal groups. Such photoresists suitably contain one or more photoacid generators and one or more optional additives such as a basic additive, surfactant agent and the like.

Polymers of the invention that are employed in photoresists imaged at 193 nm preferably will be substantially free of any phenyl or other aromatic groups. For example, preferred polymers contain less than about 5 mole percent aromatic groups, more preferably less than about 1 or 2 mole percent aromatic groups, more preferably less than about 0.1, 0.02, 0.04 and 0.08 mole percent aromatic groups and still more preferably less than about 0.01 mole percent aromatic groups. Particularly preferred polymers are completely free of aromatic groups. Aromatic groups can be highly absorbing of sub-200 nm radiation and thus are undesirable for polymers used in photoresists imaged with such short wavelength radiation.

The invention also provides photoresists that contain blends of a resin as described above and a distinct resin, e.g. a phenolic resin particularly a resin contain alkyl acrylate and phenolic units and optionally additional units such as styrene units.

The invention also provides methods for forming relief images, including methods for forming a highly resolved relief image such as a pattern of lines where each line has essentially vertical sidewalls and a line width of about 0.40 microns or less, and even a width of about 0.25, 0.20 or 0.16 microns or less. The invention further provides articles of manufacture comprising substrates such as a microelectronic wafer substrate or liquid crystal display or other flat panel display substrate having coated thereon a polymer, photoresist or resist relief image of the invention. Other aspects of the invention are disclosed infra.

DETAILED DESCRIPTION OF THE INVENTION

As discussed above, polymers of the invention contain two distinct groups (suitably as repeat units in a single resin) which groups can undergo a deblocking reaction in the presence of photogenerated acid, wherein one of the deblocking moieties is an acetal group. The second photoacid-labile group is suitably an ester, particularly as provided by polymerization of an alkyl acrylate group, such as t-butylmethacrylate.

More particularly, preferred polymers of the invention include those of the following Formula I:

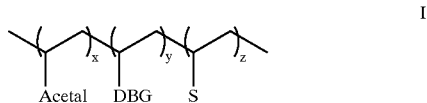

wherein in the above Formula I, Acetal is an acetal group, e.g. a group that may be grafted onto a phenolic or other hydroxy group to provide a group of the formula —O—(CXY)—O—(CX'Y')$_n$—R, wherein X, Y, X', Y' are each independent a hydrogen or non-hydrogen substituent, or one or more (CX'Y') is an aromatic group such as phenyl, n is an integer of one or greater, and typically is 1 to about 6, 7, or 8, and R is alkyl e.g. $C_{1-8}$alkyl, alicyclic such as is a carbon alicyclic group e.g. optionally substituted adamantyl, and the like;

DBG is a photoacid-labile deblocking group that is other than an acetal group, e.g. a photoacid-labile ester such as may be provided by polymerization of an alkyl acrylate, e.g. t-butylmethacrylate;

S is another polymer unit distinct from Acetal and DBG, and may or may not be a photoacid-labile group, and may be e.g. phenol such as provided by polymerization of a vinyl phenol, or other optionally substituted phenyl such as provided by polymerization of styrene or a styrene ring-substituted by e.g. one or more halo such as F, Cl or Br; $C_{1-8}$alkyl, $C_{1-8}$ alkoxy and the like;

and x, y, and z are mole percents of the respective polymer units based on total units of the polymer; and x and y are each greater than zero, and z may be zero or greater than zero; and suitably x, y and z are each independently from about 1 to 5, 10, 15, 20, 25, 30, 35, 40, 45, 50, 55, 60, or 70 mole percent based on total polymer units.

Particularly preferred polymers of the invention for use in photoresists imaged at wavelengths greater than 200 nm include those of the following Formula II:

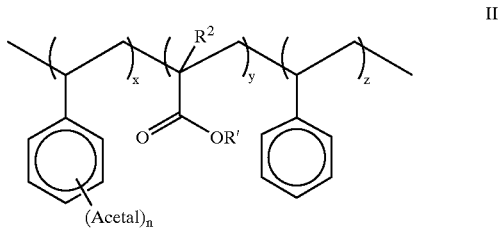

wherein in the above Formula II, each Acetal is the same or different acetal group, e.g. a group that may be grafted onto a phenolic hydroxy group to provide a group of the formula —O—(CXY)—O—(CX'Y')$_n$—R, wherein X, Y, X', Y' are each independent a hydrogen or non-hydrogen substituent, or one or more (CX'Y') is an aromatic group such as phenyl, n is an integer of one or greater, and typically is 1 to about 6, 7, or 8, and R is alkyl e.g. $C_{1-8}$alkyl, alicyclic such as is a carbon alicyclic group e.g. optionally substituted adamantyl, and the like; and preferably each Acetal group is of the formula —OCH(CH$_3$)OR where R is as defined immediately above;

n is an integer of from 1 to 5, and preferably n is 1 or 2;

R is a $C_{4-20}$alkyl group preferably with a quaternary carbon linked directly to the ester oxygen, such as t-butyl, methyladamantyl, and the like;

$R^2$ is hydrogen or $C_{1-8}$alkyl, and preferably is hydrogen or methyl, most preferably methyl;

and x, y, and z are the same as defined in Formula I above.

In the above Formulae I and II, it is understood that the depicted structures are inclusive of further substitution of the polymer backbone such as by methyl, ethyl or other optionally substituted C1–8 alkyl groups as may be provided by polymerization of a substituted vinyl group such as a methacrylate and the like.

In addition to t-butyl acrylate groups, preferred "second" deblocking groups include esters that contain a tertiary alicyclic hydrocarbon ester moiety. Preferred tertiary alicyclic hydrocarbon ester moieties are polycyclic groups such adamantyl, ethylfencyl or a tricyclo decanyl moiety. References herein to a "tertiary alicyclic ester group" or other similar term indicate that a tertiary alicyclic ring carbon is covalently linked to the ester oxygen, i.e. —C(=O)O—TR' where T is a tertiary ring carbon of alicyclic group R', such as groups of the following formulae:

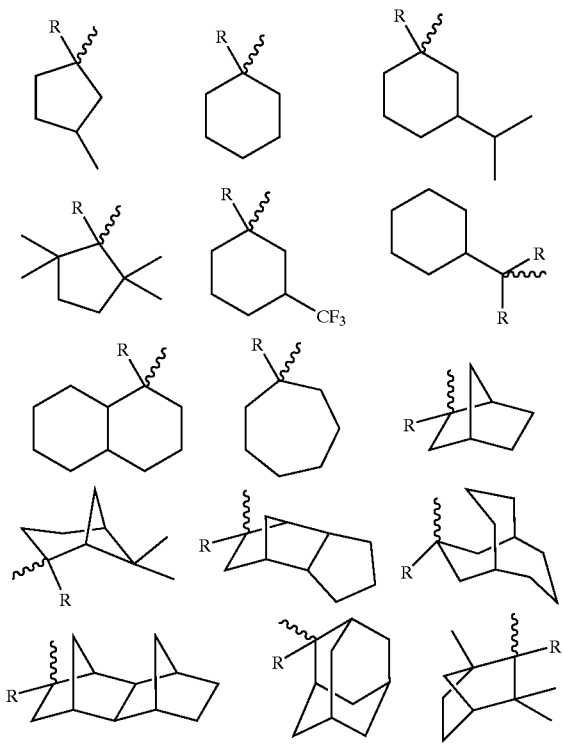

In those above formulae, the wavy line depicts a bond to the carboxyl oxygen of the ester group, and R is suitably hydrogen or more preferably optionally substituted alkyl, particularly $C_{1-8}$ alkyl such as methyl, ethyl, etc.

As discussed above, polymers of the invention also may contain additional units such as cyano units, lactone units, anhydride, phenolic, and phenyl units. For example, acrylonitrile or methacrylonitrile may be polymerized to provide pendant cyano groups, or maleic anhydride may be polymerized to provide a fused anhydride unit.

Polymers of the invention are preferably employed in photoresists imaged at short wavelengths, particularly sub-300 nm such as 248 nm and sub-200 nm such as 193 nm and 157 nm. For such higher wavelength applications, such as above 200 nm, including 248 nm, the polymer may suitably contain aromatic units, e.g. polymerized styrene or hydrostyrene units.

As discussed, various moieties of polymers of the invention may be optionally substituted. A "substituted" substituent may be substituted at one or more available positions, typically 1, 2, or 3 positions by one or more suitable groups such as e.g. halogen (particularly F, Cl or Br); cyano; $C_{1-8}$ alkyl; $C_{1-8}$ alkoxy; $C_{1-8}$ alkylthio; $C_{1-8}$ alkylsulfonyl; $C_{2-8}$ alkenyl; $C_{2-8}$ alkynyl; hydroxyl; nitro; alkanoyl such as a $C_{1-6}$ alkanoyl e.g. acyl and the like; etc.

Polymers of the invention can be prepared by a variety of methods. One suitable method is an addition reaction which may include free radical polymerization, e.g., by reaction of selected monomers to provide the various units as discussed above in the presence of a radical initiator under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). Suitable reaction solvents include e.g. tetrahydrofuran, ethyl lactate and the like. Suitable reaction temperatures for any particular system can be readily determined empirically by those skilled in the art based on the present disclosure. A variety of free radical initiators may be employed. For example, azo compounds may be employed such as azo-bis-2,4-dimethylpentanenitrile. Peroxides, peresters, peracids and persulfates also could be employed.

Other monomers that can be reacted to provide a polymer of the invention can be identified by those skilled in the art. For example, maleic anhydride is a preferred reagent to provide fused anhydride polymer units. Itaconic anhydride also is a preferred reagent to provide anhydride polymer units, preferably where the itaconic anhydride has purified such as by extraction with chloroform prior to polymerization. Vinyl lactones are also preferred reagents, such as alpha-butyrolactone. Phenolic and other phenyl units can be provided by polymerization of vinyl phenol, and other substituted and unsubstituted vinyl phenyl groups.

Preferably a polymer of the invention will have a weight average molecular weight (Mw) of about 800 or 1,000 to about 100,000, more preferably about 2,000 to about 30,000, still more preferably from about 2,000 to 15,000 or 20,000, with a molecular weight distribution (Mw/Mn) of about 3 or less, more preferably a molecular weight distribution of about 2 or less. Molecular weights (either Mw or Mn) of the polymers of the invention are suitably determined by gel permeation chromatography.

Polymers of the invention used in photoresist formulations should contain a sufficient amount of photogenerated groups to enable formation of resist relief images as desired. For instance, suitable amount of acid labile groups will be at least 1 mole percent of total units of the polymer, more preferably about 2 to 50 mole percent, still more typically about 3 to 30 or 40 mole percent of total polymer units. See the examples which follow for exemplary preferred polymers.

As discussed above, the polymers of the invention are highly useful as a resin component in photoresist compositions, particularly chemically-amplified positive resists. Photoresists of the invention in general comprise a photoactive component and a resin component that comprises a polymer as described above.

The resin component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Preferred PAGs for imaging at 193 nm and 248 nm imaging include imidosulfonates such as compounds of the following formula:

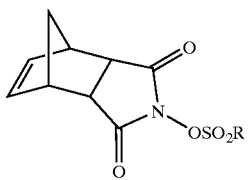

wherein R is camphor, adamantane, alkyl (e.g. $C_{1-12}$ alkyl) and perfluoroalkyl such as perfluoro($C_{1-12}$alkyl), particularly perfluorooctanesulfonate, perfluorononanesulfonate and the like. A specifically preferred PAG is N-[(perfluorooctanesulfonyl)oxy]-5-norbornene-2,3-dicarboximide.

Sulfonate compounds are also suitable PAGs, particularly sulfonate salts. Two suitable agents for 193 nm and 248 nm imaging are the following PAGS 1 and 2:

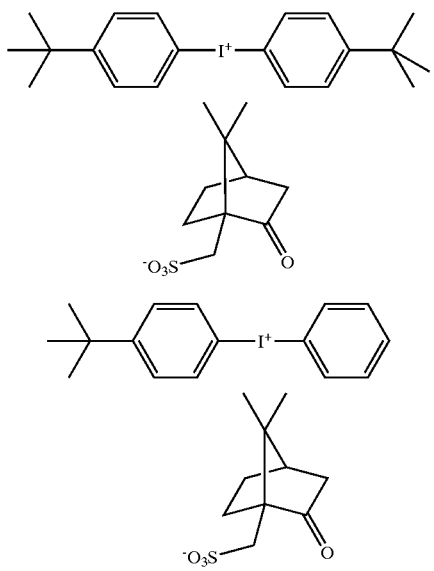

Such sulfonate compounds can be prepared as disclosed in European Patent Application 96118111.2 (publication number 0783136), which details the synthesis of above PAG 1.

Also suitable are the above two iodonium compounds complexed with anions other than the above-depicted camphorsulfonate groups. In particular, preferred anions include those of the formula $RSO_3$— where R is adamantane, alkyl (e.g. $C_{1-12}$ alkyl) and perfluoroalkyl such as perfluoro ($C_{1-12}$alkyl), particularly perfluorooctanesulfonate, perfluorobutanesulfonate and the like.

Other known PAGS also may be employed in the resists of the invention. Particularly for 193 nm imaging, generally preferred are PAGS that do not contain aromatic groups, such as the above-mentioned imidosulfonates, in order to provide enhanced transparency.

A preferred optional additive of resists of the invention is an added base, particularly tetrabutylammonium hydroxide (TBAH), or tetrabutylammonium lactate, which can enhance resolution of a developed resist relief image. For resists imaged at 193 nm, a preferred added base is a hindered amine such as diazabicyclo undecene or diazabicyclononene. The added base is suitably used in relatively small amounts, e.g. about 0.03 to 5 percent by weight relative to the total solids.

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The resists of the invention can be readily prepared by those skilled in the art. For example, a photoresist composition of the invention can be prepared by dissolving the components of the photoresist in a suitable solvent such as, for example, ethyl lactate, ethylene glycol monomethyl ether, ethylene glycol monomethyl ether acetate, propylene glycol monomethyl ether; propylene glycol monomethyl ether acetate and 3-ethoxyethyl propionate. Typically, the solids content of the composition varies between about 5 and 35 percent by weight of the total weight of the photoresist composition. The resin binder and photoactive components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 100 mJ/cm$^2$, dependent upon the exposure tool and the components of the photoresist composition.

As discussed above, coating layers of the resist compositions of the invention are preferably photoactivated by a short exposure wavelength, particularly a sub-300 and sub-200 nm exposure wavelength. As discussed above, 248 nm and 193 nm are particularly preferred exposure wavelength. 157 nm also is a preferred exposure wavelength. However, the resist compositions of the invention also may be suitably imaged at higher wavelengths. For example, a resin of the invention can be formulated with an appropriate PAG and sensitizer if needed and imaged at higher wavelengths e.g. 365 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as quaternary ammonium hydroxide solutions such as a tetra-alkyl ammonium hydroxide solution; various amine solutions preferably a 0.26 N tetramethylammonium hydroxide, such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a halogen plasma etchant such as a chlorine or fluorine-based etchant such a $Cl_2$ or $CF_4/CHF_3$ etchant applied as a plasma stream. After such processing, resist may be removed from the processed substrate using known stripping procedures.

All documents mentioned herein are incorporated herein by reference. The following non-limiting examples are illustrative of the invention.

EXAMPLE 1

Synthesis of hydroxystyrene/ethyl vinyl ether blocked hydroxystyrne/cyclohexylvinylether blocked hydroxystyrene/t-butyl acrylate tetrapolymer (59/23/8/10 mole %)

A hydroxystyrene/t-butyl acrylate copolymer (Mw=10,000) was prepared by free radical type polymerization from acetoxystyrene and t-butyl acrylate. 157.8 g of the HS/tBA copolymer is dissolved in 500 g of PGMEA. The polymer solution is added to a flask equipped with a heating mantle, stirrer, a short path distillation column and a vacuum pump. Approximately 15 g of a PGMEA/water azeotrope is distilled (50 deg. C at 40 torr) into a receiving flask to remove water from the reaction mixture. The distillation setup is disconnected, the reaction flask is purged with nitrogen and cooled to 25 deg C. A solution of 0.3 g of trifluoroacetic acid in 5 g of PGMEA is added and stirred for 10 minutes. Then a solution of ethyl vinyl ether (21.6 g),cyclohexyl vinyl ether (13.1 g) and PGMEA (40 g) is added dropwise to the reaction mixture over a 15 minute period. The reaction mixture is stirred at 25 deg. C for 18 hours, then IRA-67 ion exchange resin is added to the reaction mixture and stirred for 2 hours to remove the acid catalyst. The IRA-67 is by filtration. The resulting hydroxystyrene/ethyl vinyl ether blocked hydroxystyrne/cyclohexylvinylether blocked hydroxystyrene/t-butyl acrylate tetrapolymer (59/23/8/10 mole %) solution can be used without any isolation to formulate a resist.

EXAMPLE 2

Photoresist Preparation and Lithographic Processing

A photoresist of the invention was prepared by admixing the following materials:

1) a tetrapolymer of Example 1 above;

2) a PAG of 3.503% triphenylsulfonium camphorsulfonate PAG (3.503 weight of polymer)

3) base additive of tetrabutylammonium hydroxide (0.2 wt. % of polymer, by wt.)

4) FC430 surfactant (0.13 wt. % of total solids)

5) 60:40 v/v propyleneglycolmethyletheracetate:ethyllactate mixed solvent

The resist was prepared at 16% solids, rolled to dissolve, and then filtered to 0.2 μm using a Gelman Sciences Acrodisc PTFE filter cartridge on the "manifold" apparatus.

Lithographic Testing:

All processing was done on the TEL Mark VIII 6" wafer track. An organic antireflective coating composition was coated onto unprimed silicon wafers at 2350 RPM and baked at 205° C. for 60 seconds, yielding a 570 Å cured antireflective cured film. The above prepared photoresist was coated thereon using an appropriate spin speed to achieve a 7000 Å resist coating. Thickness measurements were made on a Prometrix SM300 using 9 points per wafers and previously-determined Cauchy coefficients for both the DUV44 and the resist. The resist softbake was 90° C. for 90 seconds. EQ0 photospeed was determined by exposing a coated wafer of the resist with a 0.1–10.0 mJ/cm² dose range using an open-field mask on an ASM-L/300 Deep UV Stepper (248.4 nm krypton fluoride laser, 0.63 numerical aperture, annular illumination=0.85 inner/0.425 outer partial coherence). The exposed film was post-exposure baked at 110° C. for 90 seconds and then developed with MF CD-26 (2.38% TMAH) developer for 60 seconds in single puddle mode. The E0 photospeed of GO010700J was 4.7 mJ/cm². The resist was then tested for imaging performance using the attenuated phase-shift contact hole reticle (6% transmittance) to produce dense and isolated contact hole features. EDWin analysis showed maximum DOF of 0.45–0.51 μm for the 0.22 μm 1:3 contact holes underexposed to 0.18 μm, 0.34–0.41 μm DOF at 10% exposure latitude, and sizing of 34.4 mJ/cm².

EXAMPLE 3

Photoresist and Processing thereof

A further preferred photoresist of the invention contains in admixture 1) a terpolymer resin that contains repeated units of polymerized i) styrene, ii) hydroxystyrene, and iii) t-butylacrylate; 2) a copolymer that contains polymerized hydroxystyrene where a portion of phenolic hydroxy groups are blocked with ethyl vinyl ether to provide the corresponding acetal groups; 3) a first photoacid generator of triphenylsulfonium perfluoroalkylsulfonate; 4) a second photoacid generator of diazodisulfone dialkyl; 5) a basic additive tetrabutylammonium hydroxide; 6) FC430 surfactant; and 7) propyleneglycolmethyletheracetate:ethyl lactate mixed solvent.

An organic antireflective coating composition coated onto unprimed silicon wafers at 2350 RPM and baked at 205° C.

for 60 seconds, yielding a 570 Å cured antireflective cured film. The above prepared photoresist is coated thereon using an appropriate spin speed to achieve a 7000 Å resist coating. The coated photoresist is softbaked at 90° C. for 90 seconds. The softbaked resist layer is imaged with a photomask using a Deep UV Stepper. The exposed film is post-exposure baked at 110° C. for 90 seconds and then developed with MF CD-26 (2.38% TMAH) developer.

The foregoing description of the invention is merely illustrative thereof, and it is understood that variations and modification can be made without departing from the spirit or scope of the invention as set forth in the following claims.

What is claimed is:

1. A chemically-amplified positive photoresist composition comprising:

(a) a photoacid generator compound; and
   (b) a polymer that comprises i) phenyl groups with one or more acetal substituents; ii) alkyl-acrylate photoacid-labile groups; iii) phenolic groups; and iv) lactone groups.

2. A method of forming a positive photoresist relief image comprising:

applying a coating layer of a photoresist of claim 1 on a substrate; and exposing and developing the photoresist layer to yield a relief image.

3. The method of claim 2 wherein the photoresist layer is exposed to radiation having a wavelength of 248 nm.

4. A method of forming a positive photoresist relief image comprising:

applying on a substrate a coating layer of a photoresist comprising photoacid generator compound and a polymer that is at least substantially free of aromatic groups and comprises i) a photoacid-labile acetal group; ii) a photoacid-labile group that is distinct from the photoacid-labile acetal group; and iii) a lactone group; and exposing to radiation having a wavelength of 193 nm and developing the photoresist layer to yield a relief image.

5. The method of claim 4 wherein the polymer is completely free of aromatic groups.

6. The method of claim 4 wherein the photoacid-labile group ii) is other than an acetal group.

7. The method of claim 4 wherein the photoacid-labile group ii) is an ester.

8. The method of claim 4 wherein the photoacid-labile group ii) is provided by polymerization of an alkyl acrylate group.

\* \* \* \* \*